(12) United States Patent
Ramachandran et al.

(10) Patent No.: US 7,270,130 B2
(45) Date of Patent: Sep. 18, 2007

(54) SEMICONDUCTOR DEVICE CLEANING EMPLOYING HETEROGENEOUS NUCLEATION FOR CONTROLLED CAVITATION

(75) Inventors: Ravikumar Ramachandran, Pleasantville, NY (US); David Lee Rath, Stormville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 629 days.

(21) Appl. No.: 10/685,684

(22) Filed: Oct. 15, 2003

(65) Prior Publication Data

US 2005/0081884 A1 Apr. 21, 2005

(51) Int. Cl.
*B08B 3/12* (2006.01)
(52) U.S. Cl. .............. 134/1.3; 134/2; 134/3; 134/26; 134/902; 257/E21.228
(58) Field of Classification Search ............ 134/1.3, 134/2, 3, 26, 902; 257/E21.228
See application file for complete search history.

(56) References Cited

U.S. PATENT DOCUMENTS

| | | | |
|---|---|---|---|
| 5,681,396 A | 10/1997 | Madanshetty | |
| 5,800,626 A | 9/1998 | Cohen et al. | |
| 6,033,996 A | 3/2000 | Rath et al. | |
| 6,167,891 B1 | 1/2001 | Kudelka et al. | |
| 6,191,085 B1 | 2/2001 | Cooper et al. | |
| 6,295,998 B1 | 10/2001 | Kudelka et al. | |
| 6,418,942 B1 | 7/2002 | Gray et al. | |
| 6,944,097 B1 * | 9/2005 | Ferrell | 367/131 |
| 2004/0187891 A1 * | 9/2004 | Chou et al. | 134/1 |

OTHER PUBLICATIONS

"Cleaning Techniques for Wafer Surfaces", Semiconductor international, Aug. 1987, pp. 81-85.*
Damage Due to Spot Cavitation on Hemispherical Cylindrical Body (Comparison between Isolated Cavity and Parallel Cavities), Seiji Shimizu, Akihiro Ihara, Motoo Okada and Motoyasu Sakurai, Hiroshima Institute of Technology, CAV2001: Session A3.004, pp. 1-8, 2001. Retrieved from Internet <URL:cav2001.library.caltech.edu/archive/00000345/00/Spot_Cavitation_2001(full_paper_with figures). pdf>.
The Dynamics and Thermodynamics of Phase Transformations, Department of Mechanical and Materials Engineering Materials, Engineering 203/ Materials Chemistry 204 Laboratory Notes, Semester 1, 2002, pp. 1-2.
Similarities and Geometrical Effects on Rotating Cavitation in Two Scaled Centrifugal Pumps, Michael Hoffman, Bernd Stoffel, Jens Friedrichs, Gunter Kosyna, 2001, Retrieved from Internet <URL:cav2001.library.caltech.edu/archive/00000182/00/paper_68_001.pdf>.

* cited by examiner

*Primary Examiner*—Zeinab El-Arini
(74) *Attorney, Agent, or Firm*—Slater & Matsil, L.L.P.

(57) ABSTRACT

The present invention provides a method for cleaning semiconductor devices through heterogeneous nucleation of cavitation bubbles. Heterogeneous nucleation is performed by applying sonic energy to a cleaning solution and a phase material in order to remove unwanted particles from semiconductor devices. A surfactant may be added to the phase material and the cleaning solution.

24 Claims, 1 Drawing Sheet

SEMICONDUCTOR DEVICE CLEANING EMPLOYING HETEROGENEOUS NUCLEATION FOR CONTROLLED CAVITATION

BACKGROUND OF THE INVENTION

The present invention relates to semiconductor fabrication. More particularly, the present invention relates to cleaning of semiconductor devices by applying sonic vibrations to remove impurities or foreign material from the devices.

Semiconductor devices are employed in various systems for a wide range of applications. These devices are fabricated in a series of processing steps. The steps may include depositing material on a semiconductor wafer, patterning the material, etching selected portions of the material, doping, cleaning the semiconductor wafer and repeating one or more of these steps. Typically, up to one fifth of all processing steps involve some form of cleaning. As used herein, the term "semiconductor wafer" includes any substrate, microelectronic device, chip or the like, at any stage of fabrication, which is used to form an integrated circuit or other electronic circuitry.

Cleaning removes unwanted particles from the semiconductor wafer. As used herein, a "particle" means any impurity, foreign particle or other material that is unwanted or is not supposed to be present on a surface of the semiconductor wafer. For example, particles include organic and inorganic residues introduced by prior wafer processing steps. If not removed, particles may adversely affect device fabrication or performance. The direct impact of these particles is a deterioration of manufacturing chip yield. For example, particles may interfere with subsequent deposition or etching steps by covering areas of interest. Particles may cause short circuits by blocking subsequent dielectric depositions between conducting lines, e.g., when the conducting lines are connected by foreign particles that are conductive.

The cleaning process typically involves applying a cleaning solution to the surface of the semiconductor wafer. There are various cleaning solutions that are used. By way of example, one such solution is called the "standard clean 1" (SC1), which includes alkaline solutions of, e.g., hydrogen peroxide ($H_2O_2$) and ammonium hydroxide ($NH_4OH$) in deionized water. The "Huang A" cleaning solution includes the same chemistry. Another cleaning solution is called the "standard clean 2" (SC2), which includes, e.g., $H_2O_2$ and hydrogen chloride (HCl) in deionized water. A conventional "RCA" cleaning process employs an SC1 sequence followed by an SC2 sequence. These solutions are prepared by mixing the chemical components with water to achieve the desired ratio. These and other cleaning solutions (and sequences) are also known as aqueous solutions.

Sonic waves (i.e., sound waves) may be applied to the cleaning solution in order to enhance the cleaning process. Sonic waves are typically produced by a transducer external to a wafer-cleaning tank. Ultrasonic waves on the order of tens to hundreds of kilohertz (KHz) or megasonic waves on the order of millions of hertz (MHz) are typically used. Megasonic and ultrasonic waves produce acoustic cavitation and rectified diffusion in the cleaning solution. Cavitation is the sudden formation and collapse of low-pressure bubbles. In rectified diffusion, bubbles will oscillate due to an (externally) applied acoustic energy source. There is diffusion of gas into these bubbles during one-half cycle of the acoustic wave. During the other half-cycle of the acoustic wave, there is diffusion out of the gas bubbles. The diffusion rates are not similar and therefore the bubbles increase in size and oscillate. When the bubbles created by the cavitation collapse, energy is imparted to the particles. The energy is typically sufficient to dislodge or "scrub" the particles from surfaces of the semiconductor wafer. One drawback to using ultrasonic waves is that at lower frequencies, for example in the range of 10 KHz to 70 KHz, the energy released when the bubbles collapse may be great enough to damage the semiconductor device. It has been hypothesized that even at higher frequencies, significant damage may occur in small-scale devices.

The cavitation process includes nucleation, bubble growth and collapse of the gas bubbles in an applied acoustic energy source. Homogeneous nucleation occurs when the cleaning solution is free of impurities or additives and the reaction vessel is defect-free. Particles on a wafer could act as a nucleating source. Defect sites can be, e.g., small cracks on the walls of the vessel or chamber in which cavitation occurs. Homogeneous nucleation is difficult to control, because the absence of any defect sites means that the gas bubbles have to form within a liquid phase. It is difficult to repeat or controllably produce the same number of homogenous nucleating bubbles in subsequent semiconductor batches. Because particle removal is understood to take place through the transfer of energy from the oscillating bubbles, if the original number of bubbles is different from run to run among different semiconductor batches, there would be differences in particle removal efficiency. This, in turn, means that the cavitation process is not as effective as it could be. Thus, particle removal efficiency suffers because of the lack of control.

Another drawback to current cleaning processes is inefficient removal of small-size particles. Improvements in semiconductor device manufacturing, such as decreased cost and increased capacity, are often achieved by shrinking device size. As devices shrink, small particles become more problematic. By way of example only, the feature size of a semiconductor device may be on the order of a fraction of a micron (e.g., 0.1 to 0.5 μm). Small particles, for example those on the order of 0.15 μm or less, may be held to a surface by forces such as the van der Waals force or by capillary force. Unfortunately, conventional ultrasonic and megasonic cleaning techniques may not remove a necessary amount of such small particles as effectively as they remove larger size particles. Therefore, a need exists for more robust nucleation processes that improve particle removal.

SUMMARY OF THE INVENTION

In accordance with an embodiment of the present invention, a method of cleaning a semiconductor device is provided. The method comprises first applying a cleaning solution to a surface in the semiconductor device. An additive is then introduced into the cleaning solution. An emulsion is formed with the cleaning solution and the additive. Sonic waves are applied to the emulsion to induce cavitation, whereby bubbles are formed on the surface of the semiconductor device to facilitate removing particles from the surface. Preferably, the additive is an organic liquid. More preferably, the organic liquid is a straight-chained alcohol, a side-chained alcohol, a straight-chained alkane or a side-chained alkane. In one example, the organic liquid is immiscible or partly miscible and is capable of forming a hydrophobic phase (the cleaning solution may be viewed as the primary phase and the added material may be viewed as a second phase) in the cleaning solution.

Preferably, the sonic wave are megasonic waves, which may be chosen such that the additive forms droplets in the cleaning solution of size less that 5 μm in diameter. In another example, the additive is less than 10 percent by volume with respect to the cleaning solution. Preferably, the method further includes adding a surfactant to aid in the emulsification. The surfactant is preferably added at a concentration less than the critical micelle concentration. More preferably, the surfactant concentration is less than 10 percent of its critical micelle concentration.

In accordance with another embodiment of the present invention, a method of cleaning a semiconductor device is provided. The method comprises apply a cleaning solution to the semiconductor device, introducing a phase material into the cleaning solution, and applying sonic waves to the cleaning solution and the phase material in order to remove particles from the semiconductor device. In one alternative, the method further comprises adding a surfactant to the phase material and the cleaning solution. Preferably, the surfactant is added at a concentration less than its critical micelle concentration. Furthermore, sonic waves are preferably applied to the cleaning solution, the phase material and the surfactant to form a stable emulsion. The cleaning solution is preferably at a temperature that is less than its boiling temperature. The surfactant preferably has a carbon chain of between C6 to C18. The surfactant may be cationic or anionic.

DETAILED DESCRIPTION

The aspects, features and advantages of the present invention will be further appreciated when considered with reference to the following description of preferred embodiments and accompanying drawings. It is to be appreciated that the numbers used (by way of example only, temperature, frequency and volume) are approximations and may be varied. The elements in the figures are not to scale. Furthermore, certain steps may be performed in different order, or at the same time.

The present invention employs "heterogeneous" nucleation to improve the cleaning process and to help control cavitation. Unlike homogeneous nucleation, heterogeneous nucleation introduces an additive to the cleaning solution. The additive improves bubble nucleation, which can differ significantly depending on whether the bubble is formed in conjunction with a hydrophilic site or a hydrophobic site.

Differences between hydrophilic and hydrophobic site bubble formation can be explained by analyzing the contact induction time of a bubble, which is the time it takes after a bubble is introduced on a solid surface to attach to it. When the site is hydrophobic, the contact induction time is on the order of microseconds, indicating that the bubble attaches rather quickly. When the site is hydrophilic, the contact induction time is on the order of milliseconds, which signifies that the bubble attachment to a hydrophilic surface is longer. Introduction of an additive (e.g., an organic additive) that is preferably hydrophobic in nature can help with heterogenous nucleation and reduce the time for bubble attachment. Particle removal studies have shown that in the presence of an externally applied megasonic energy field, the transfer of energy through the cavitating bubbles aides with particle removal. Therefore, in a system where there is a presence of an additive that facilitates the nucleation of cavitating bubbles, this would indirectly help with the particle removal efficiency. Also, the application of sonic waves may increase the number of nucleation sites provided by the additive, further enhancing the probability of nucleation of the gas bubbles.

Figure 1C:
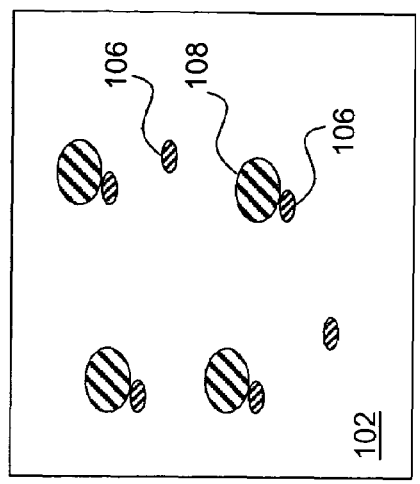
FIG. 1C illustrates a further step in a cleaning process in accordance with aspects of the present invention.
Figure 1B:
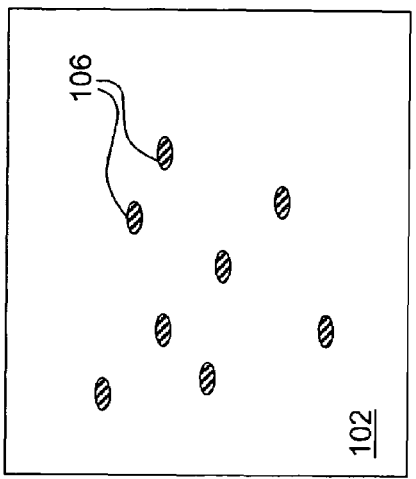
FIG. 1B illustrates a subsequent step in a cleaning process in accordance with aspects of the present invention.
Figure 1A:
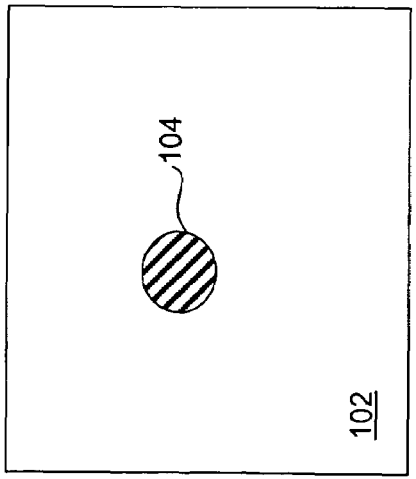
FIG. 1A illustrates a step in a process of cleaning a semiconductor device in accordance with aspects of the present invention.

FIG. 1A illustrates an additive or second-phase material 104 that is introduced into a cleaning solution 102 on a semiconductor wafer. The figure shows the second-phase material 104 in droplet form. The second-phase material 104 may be any material that is immiscible or partially miscible and is capable of forming hydrophobic nucleation sites in the cleaning solution 102. The second-phase material 104 may be chosen such that it is readily dissolvable during subsequent semiconductor wafer processing steps, for example during isopropyl alcohol ("IPA") drying. Mere introduction of the second-phase material 104 into the cleaning solution may form the emulsion. Application of sound waves breaks up the emulsion into different droplets (e.g., microdroplets that may operate as nucleation sites) depending on the applied frequency.

Preferably, the second-phase material 104 is an organic material. The organic material should be selected to have reduced solubility of less than about 10% in water. More preferably, the second-phase material 104 is a straight or side-chained alcohol, or a straight or side-chained alkane having, e.g., a structure of C6 or greater.

When the cleaning solution 102 having droplets of the second-phase material 104 therein is exposed to ultrasonic or megasonic waves, the second-phase material 104 splits into microdroplets 106, as shown in FIG. 1B. The presence of megasonic waves preferably produces microdroplets 106 less than about 5 μm. Ignoring other factors, the higher the frequency, the smaller the droplet size. The ultrasonic or megasonic waves may be applied to the cleaning solution 102 before or after the introduction of the second-phase material 104. The cleaning solution 102 and the microdroplets 106 may form an emulsion that is the same or different than the emulsion (if any) formed by the cleaning solution 102 and the second-phase material 104. In the present stage, the cleaning solution 102 is a first phase of the emulsion and the microdroplets 106 are a second phase of the emulsion. The emulsion is preferably stable for the duration of the cleaning process. Some of the microdroplets 106 provide sites for bubbles 108, as shown in FIG. 1C.

The temperature of the cleaning process is often dictated by the equipment used and by the temperature of the cleaning solution. However, the emulsion is preferably produced at a temperature of less than 75° C., e.g., wherein the cleaning solution is at a temperature below 75° C. More preferably, the temperature is maintained between 25° C. and 75° C. Ideally, the maximum temperature is at a point just below the boiling point of the cleaning solution 102 when it is infused with the second phase-material 104. The cleaning solution 102 may be heated prior to the introduction of the second phase-material 104, or heat may be applied at a later processing step such as before or during the application of ultrasonic or megasonic waves.

As discussed above, ultrasonic frequencies in the range of 10 KHz to 70 KHz should be avoided due to the potential for damage to the semiconductor wafer. In one embodiment of the present invention, the operating frequency is preferably in the range of 700 KHz to 1.5 MHz. In other embodiment, the operating range may be much broader, e.g., in the range of 700 KHz to 15 MHz. Other frequency ranges may be employed depending upon various manufacturing criteria, such as device site, particle size, reaction vessel type, additive chemistry, temperature, etc.

The number of microdroplets 106 depends on the volume of second-phase material 104 in the cleaning solution 102. Controlling the amount of second-phase material 104 allows for control over the cavitation process, which, in turn, provides for effective and repeatable results. The ratio of the second-phase material 104 to the cleaning solution 102 is preferably less than 10% by volume. More preferably, this ratio is less than 1% by volume.

Another embodiment of the present invention adds a surfactant in addition to the second-phase material 104. The surfactant is introduced to enhance the stability of the emulsion. Preferably, the concentration of the surfactant is less than its critical micelle concentration ("CMC"). This avoids making the bubbles overly rigid. Excessive rigidity would make the bubbles less responsive to the sonic field. Preferably, the concentration of the surfactant added to the second-phase material 104 and the cleaning solution 102 is on the order of 10% of the CMC. The surfactant may be chosen such that it is readily dissolvable during subsequent processing steps, for example when using IPA for wafer drying. In an alternative, two or more different surfactants may be added along with the second-phase material 104 to the cleaning solution 102. Preferred surfactants can have, by way of example only, carbon chains numbering between C6 to C18, and could be of either the anionic or cationic type. An example of an anionic surfactant is dodecyl sulphate. Examples of cationic surfactants include cetyl trimethyl ammonium bromide (CTAB) and hexadecyl trimethyl ammonium bromide (HTAB).

One advantage of the present invention is that heterogeneous nucleation employing a second-phase material provides for control over the cavitation process. In the absence of a second-phase material, the nucleation process of cavitation bubbles is difficult to control. With the addition of the second-phase material to the cleaning solution, under an applied external frequency field, the number of sites for the cavitation bubbles to nucleate is well controlled. Another advantage of the present invention is the use of surfactants to increase the stability of the emulsion, which in turn, indirectly improves the cleaning efficiency. A further advantage is that the second phase-material and/or surfactant may be chosen such that they can be easily dissolved or otherwise removed during the subsequent processing.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of cleaning a semiconductor device, comprising:
applying a cleaning solution to a surface of the semiconductor device;
introducing an immiscible or partly immiscible additive into the cleaning solution to form heterogeneous nucleation sites in said cleaning solution;
forming an emulsion with the cleaning solution and the additive;
applying sonic waves to the emulsion to induce cavitation, whereby an increased number of bubbles are formed on the surface of the semiconductor device to facilitate particle removal from the surface thereof as a result of said heterogeneous nucleation sites in said cleaning solution.

2. The method of claim 1, wherein the additive is an organic liquid.

3. The method of claim 2, wherein the organic liquid is selected from the group consisting of a straight-chained alcohol, a side-chained alcohol, a straight-chained alkane and a side-chained alkane.

4. The method of claim 2, wherein the organic liquid forms a hydrophobic phase in the cleaning solution.

5. The method of claim 1, wherein the sonic waves are megasonic waves.

6. The method of claim 5, wherein the megasonic waves are at a frequency such tat the additive forms cleaning solution droplets of less than 5 μn in diameter.

7. The method of claim 1, wherein the sonic waves are between 700 KHz and 15 MHz.

8. The method of claim 1, wherein the cleaning solution is an SC1 solution or an SC2 solution.

9. The method of claim 1, wherein the cleaning solution is at a temperature below about 75° C.

10. The method of claim 1, wherein the additive has a ratio with respect to the cleaning solution of less than about 10% by volume.

11. The method of claim 1, further comprising adding a surfactant to aid in emulsification.

12. The method of claim 11, wherein the surfactant having a known critical micelle concentration is added to said cleaning solution at a concentration less than the critical micelle concentration.

13. The method of claim 12, wherein the concentration of the surfactant is less than 10% of the critical micelle concentration.

14. The method of claim 1, wherein the sonic waves are applied after said step of introducing an additive.

15. A method of cleaning a semiconductor device, comprising:
applying a cleaning solution to the semiconductor device;
introducing an immiscible or partially immiscible phase material into the cleaning solution to form heterogeneous nucleation sites in said cleaning solution; and
applying sonic waves to the cleaning solution and the phase material to form bubbles at said heterogeneous nucleation sites in order to remove particles from the semiconductor device.

16. The method of claim 15, wherein the sonic waves are megasonic waves.

17. The method of claim 15, wherein introducing the phase material into the cleaning solution forms an emulsion.

18. The method of claim 15, further comprising adding a surfactant to the phase material and the cleaning solution.

19. The method of claim 18, wherein the surfactant having a known critical micelle concentration is added at a concentration less than the critical micelle concentration, and applying the sonic waves to the cleaning solution, the phase material and the surfactant forms a stable emulsion.

20. The method of claim 18, wherein the surfactant has a carbon chain of between C6 to C18.

21. The method of claim 18, wherein the surfactant is cationic.

22. The method of claim 18, wherein the surfactant is anionic.

23. The method of claim 15, wherein the cleaning solution is at a temperature less than its boiling temperature.

24. The method of claim 15, wherein the additive has a ratio with respect to the cleaning solution of less than about 10% by volume.

* * * * *

UNITED STATES PATENT AND TRADEMARK OFFICE
CERTIFICATE OF CORRECTION

PATENT NO. : 7,270,130 B2 Page 1 of 1
APPLICATION NO. : 10/685684
DATED : September 18, 2007
INVENTOR(S) : Ramachandran et al.

It is certified that error appears in the above-identified patent and that said Letters Patent is hereby corrected as shown below:

In Col. 6, line 21, delete "tat" and insert --that--.
In Col. 6, line 22, delete "μn" and insert --μm--.

Signed and Sealed this

Twenty-seventh Day of November, 2007

JON W. DUDAS
*Director of the United States Patent and Trademark Office*